(12) United States Patent
Mantz

(10) Patent No.: US 7,990,727 B1
(45) Date of Patent: Aug. 2, 2011

(54) BALL GRID ARRAY STACK

(75) Inventor: Frank Mantz, Torrance, CA (US)

(73) Assignee: Aprolase Development Co., LLC, Wilmington, DE (US)

( * ) Notice: Subject to any disclaimer, the term of this patent is extended or adjusted under 35 U.S.C. 154(b) by 59 days.

(21) Appl. No.: 11/731,154

(22) Filed: Mar. 31, 2007

Related U.S. Application Data

(60) Provisional application No. 60/787,923, filed on Apr. 3, 2006.

(51) Int. Cl.
*H05K 1/14* (2006.01)

(52) U.S. Cl. ........ 361/742; 361/695; 361/717; 361/820; 257/676; 257/686; 257/698; 174/256; 174/552

(58) Field of Classification Search ................ 361/747, 361/695, 717, 767, 820, 742; 257/676, 686, 257/698; 174/256, 552
See application file for complete search history.

(56) References Cited

U.S. PATENT DOCUMENTS

| | | | | |
|---|---|---|---|---|
| 5,073,294 A * | 12/1991 | Shannon et al. | ......... | 252/299.01 |
| 5,198,887 A * | 3/1993 | Brown | ........................... | 361/717 |
| 5,367,124 A * | 11/1994 | Hoffman et al. | ............... | 174/552 |
| 5,528,466 A * | 6/1996 | Lim et al. | ........................ | 361/820 |
| 5,672,414 A * | 9/1997 | Okamoto et al. | ............. | 428/209 |
| 5,696,031 A | 12/1997 | Wark | | |
| 5,770,300 A * | 6/1998 | Okamoto et al. | ............. | 428/209 |
| 5,911,112 A * | 6/1999 | Kirkman | ....................... | 438/612 |
| 5,960,261 A * | 9/1999 | Lee | ................................ | 438/123 |
| 5,973,403 A | 10/1999 | Wark | | |
| 6,028,352 A | 2/2000 | Eide | | |
| 6,081,026 A | 6/2000 | Wang et al. | | |
| 6,153,922 A * | 11/2000 | Sugiyama et al. | ............ | 257/666 |
| 6,188,127 B1 * | 2/2001 | Senba et al. | ................... | 257/686 |
| 6,251,707 B1 * | 6/2001 | Bernier et al. | ................. | 438/122 |
| 6,294,838 B1 * | 9/2001 | Peng | .............................. | 257/777 |
| 6,323,060 B1 | 11/2001 | Isaak | | |
| 6,414,381 B1 * | 7/2002 | Takeda | .......................... | 257/676 |
| 6,455,936 B1 * | 9/2002 | Lo et al. | ......................... | 257/758 |
| 6,489,670 B1 * | 12/2002 | Peterson et al. | ................ | 257/686 |
| 6,531,773 B2 * | 3/2003 | Nishizawa et al. | ........... | 257/723 |
| 6,541,867 B1 * | 4/2003 | Fjelstad | ......................... | 257/773 |
| 6,639,416 B1 | 10/2003 | Akram et al. | | |
| 6,706,971 B2 | 3/2004 | Albert | | |
| 6,737,738 B2 * | 5/2004 | Koh et al. | ...................... | 257/686 |
| 6,759,272 B2 * | 7/2004 | Tsubosaki et al. | ............. | 438/109 |
| 6,774,478 B2 * | 8/2004 | Eto et al. | ........................ | 257/686 |
| 6,798,057 B2 * | 9/2004 | Bolkin et al. | .................. | 257/686 |
| 6,803,886 B2 * | 10/2004 | Kondo et al. | ...................... | 345/8 |
| 6,806,559 B2 | 10/2004 | Gann | | |
| 6,818,977 B2 | 11/2004 | Poo et al. | | |
| 6,847,220 B2 * | 1/2005 | Tay et al. | ....................... | 324/755 |
| 6,967,411 B2 * | 11/2005 | Eide | ............................... | 257/781 |
| 7,052,355 B2 * | 5/2006 | Liu et al. | ........................... | 445/24 |
| 7,205,645 B2 * | 4/2007 | Nakamura et al. | ............ | 257/686 |
| 7,242,100 B2 * | 7/2007 | Oka | ............................... | 257/778 |

(Continued)

*Primary Examiner* — Xiaoliang Chen

(57) ABSTRACT

The invention discloses a device comprising a stack of at least two layers, which may comprise active or passive discrete components, TSOP and/or ball grid array packages, flip chip or wire bonded bare die or the like, which layers are stacked and interconnected to define an integral module. A first and second layer comprise an electrically conductive trace with one or more electronic components in electrical connection therewith. The electrically conductive traces terminate at a lateral surface of each of the layers to define an access lead. An interposer structure is disposed between the layers and provides an interposer lateral surface upon which a conductive layer interconnect trace is defined to create an electrical connection between predetermined access leads on each of the layers.

20 Claims, 1 Drawing Sheet

U.S. PATENT DOCUMENTS

| | | | |
|---|---|---|---|
| 7,268,016 B2 * | 9/2007 | Minamio et al. | 438/110 |
| 7,319,275 B2 * | 1/2008 | Cowens et al. | 257/778 |
| 7,333,147 B2 * | 2/2008 | Adachi et al. | 348/374 |
| 7,352,052 B2 * | 4/2008 | Imoto et al. | 257/622 |
| 2001/0001504 A1 * | 5/2001 | Sugiyama et al. | 257/666 |
| 2001/0050183 A1 * | 12/2001 | Lubert et al. | 174/265 |
| 2002/0015340 A1 * | 2/2002 | Batinovich | 365/200 |
| 2002/0048849 A1 | 4/2002 | Isaak | |
| 2002/0061665 A1 | 5/2002 | Batinovich | |
| 2002/0076919 A1 | 6/2002 | Peters et al. | |
| 2002/0105083 A1 | 8/2002 | Sun et al. | |
| 2003/0127712 A1 * | 7/2003 | Murakami et al. | 257/666 |
| 2003/0173673 A1 | 9/2003 | Val | |
| 2003/0232460 A1 | 12/2003 | Poo et al. | |
| 2004/0012078 A1 | 1/2004 | Hortaleza | |
| 2004/0012992 A1 * | 1/2004 | Koh et al. | 365/63 |
| 2004/0035840 A1 * | 2/2004 | Koopmans | 219/209 |
| 2004/0104469 A1 * | 6/2004 | Yagi et al. | 257/723 |
| 2005/0088833 A1 * | 4/2005 | Kikuchi et al. | 361/763 |
| 2005/0184372 A1 * | 8/2005 | Asahi et al. | 257/678 |
| 2005/0194676 A1 * | 9/2005 | Fukuda et al. | 257/698 |
| 2005/0221094 A1 * | 10/2005 | Uchida et al. | 428/418 |
| 2006/0055039 A1 * | 3/2006 | Eide | 257/738 |
| 2006/0157843 A1 * | 7/2006 | Hwang | 257/686 |
| 2006/0170090 A1 * | 8/2006 | Shinma et al. | 257/686 |
| 2007/0001278 A1 * | 1/2007 | Jeon et al. | 257/676 |
| 2007/0128766 A1 * | 6/2007 | Yip | 438/108 |

* cited by examiner

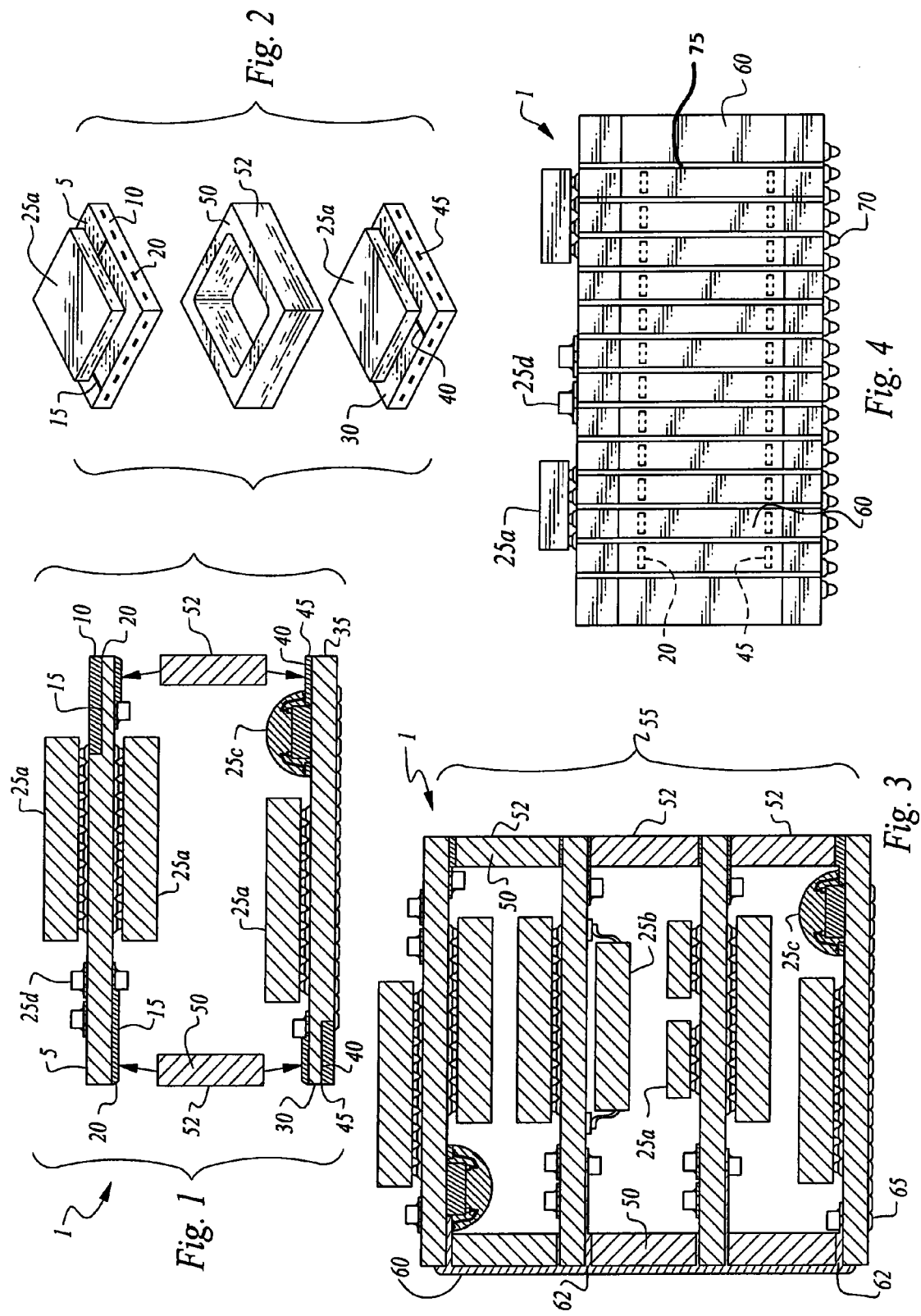

BALL GRID ARRAY STACK

CROSS REFERENCE TO RELATED APPLICATIONS

This application is related to U.S. provisional patent application No. 60/787,923 filed Apr. 3, 2006, entitled "Ball Grid Array Stack Using Picture Frame Interconnect" which is incorporated herein by reference and to which priority is claimed pursuant to 35 U.S.C. 119.

STATEMENT REGARDING FEDERALLY SPONSORED RESEARCH AND DEVELOPMENT

NA

BACKGROUND OF THE INVENTION

1. Background of the Invention

The invention relates generally to stacked microelectronic modules. Specifically, the invention relates to a device comprised of stacked integrated circuit (IC) package layers, such as ball grid array packages (BGA), thin small outline packages, (TSOPS) or connected bare die IC chip layers. The layers may optional include other active or passive electronic components such as surface mounted resistors, capacitors or the like.

The various electronic components in the layers can be connected to an external circuit by means of one or more interposer structures comprising conductive traces on one or more lateral surfaces of the claimed package to define conductive "T-connect" structures which route predetermined circuit signals to predetermined locations.

In the microelectronics industry, there are significant advantages to stacking and interconnecting commercial off the shelf (COTS) integrated circuit packages. The primary advantage of stacking integrated circuits is maximum utilization of limited surface area on a printed circuit board. Vertically stacking integrated circuit packages provides increased circuit density without requiring additional printed circuit board space. Further, stacking integrated circuit packages reduces signal lead lengths between the stacked components, reducing parasitic inductance and capacitance, which in turn, allows the circuits to operate at high clock speeds.

The use of COTS components also provides the advantage of ensuring the stack contains fully burned in, tested and functional die, i.e., ensures the use of known good die (KGD) in the stack.

Industry has recognized the value of stacking COTS integrated circuits as is reflected in U.S. Pat. Nos. 6,028,352 to Eide, 6,806,559 to Gann, and 6,706,971, to Albert, U.S. Pat. No. 6,967,411 to Eide, all to common assignee, Irvine Sensors Corp. and each of which is incorporated fully herein by reference.

The current microelectronic packaging trend is toward ball grid array packages which comprise an array of solder ball interconnections for I/O to and from the internal integrated circuit die on the lower major surface of the BGA package. The solder balls are reflowed to a registered set of conductive pads on an external circuit for interconnection therewith. It is therefore desirable and a need exists to provide a device that optionally takes advantage of the benefits of stacking and that can accommodate ball grid array packages, surface mount, TSOP or other electronic package formats, which device can be adapted for connection with a standard BGA or other user-defined printed circuit board pattern.

2. Brief Summary of the Invention

The present invention is a device comprising a stack of at least two layers, each of which may comprise active and/or passive discrete components, TSOP and/or ball grid array packages, bare integrated circuit die, which layers are stacked and interconnected to define a microelectronic package. The aforementioned electronic devices are collectively, but without limitation, referred to herein as electronic components.

A first layer comprises an electrically conductive trace with one or more electronic components in electrical connection therewith. The electrically conductive trace terminates at a lateral edge of the first layer to define an access lead.

A second layer comprises an electrically conductive trace with one or more electronic components in electrical connection therewith. The electrically conductive trace terminates at a lateral edge of the second layer to define an access lead.

An interposer structure is disposed between the layers and provides one or more lateral surfaces upon which a layer interconnect trace is defined to create an electrical connection between the respective access leads on each of the layers. The conductive traces on the second layer may readily be electrically connected to an external circuit using a ball grid array pattern, wirebonding or equivalent means.

In the above device, all manner of electronic devices can be efficiently stacked and interconnected in a reliable, low cost microelectronic module.

While the claimed device has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

BRIEF DESCRIPTION OF THE DRAWINGS

FIG. 1 is a cross-section of a first preferred embodiment of a two layer electronic package of the invention.

FIG. 2 is an exploded view of the major elements of a preferred embodiment of the electronic package of the invention.

FIG. 3 illustrates a cross-section of a three-layer electronic package of the invention.

FIG. 4 shows a side view of a two layer electronic package of the invention, reflecting the layer interconnect traces defined on the module lateral surface and the underlying layer access leads of the respective layers.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENT

Turning now to the figures wherein like numerals identify like elements among the several views, FIGS. 1 and 2 show a cross-section and exploded view of a preferred embodiment of the multi-layer electronic package 1 of the invention in a two-layer configuration. It is expressly noted that the invention is not limited to two layers but may comprise three or more layers as reflected in FIG. 3, depending upon the end needs of the user.

Package 1 is comprised of a first layer 5 having a first layer lateral surface 10 and at least one first layer electrically conductive trace 15. First layer 5 may be comprised of a single or multilayer printed circuit board construction or equivalent structure such as FR4 or equivalent organic material comprising electrically conductive traces. First layer conductive trace 15 terminates at first layer lateral surface 10 to define a first layer access lead 20 which is defined by the cross-sectional area of the trace.

First layer 5 is further comprised of one or more electronic components 25 which may, by way of example and not by limitation, be one or more prepackaged integrated circuit chips, e.g. ball grid array packages 25a, thin small out line packages 25b, bare die 25c or discrete electronic components such as capacitors or resistors 25c. Bare die 25c may desirably be connected to first layer conductive trace 15 by means of wire bonding, conductive epoxy, solder or flip chip ball bond attachment.

The electronic components 25 comprise a user-defined electronic circuit or partial electronic circuit, at least one of which is in electrical connection with the first layer conductive trace 15 and first layer access lead 20.

In a preferred embodiment, electronic components 25 are provided on both major surfaces of first layer 5 as illustrated in FIG. 1

Package 1 is further comprised of a second layer 30 having a second layer lateral surface 35 and at least one second layer electrically conductive trace 40. As above, second layer 30 may be comprised of a single or multilayer printed circuit board construction or equivalent structure such as FR4 or organic material comprising electrically conductive traces. Second layer conductive trace 40 terminates at second layer lateral surface 35 to define a second layer access lead 45 which is defined by the cross-sectional area of the trace.

Second layer 30 is further comprised of one or more electronic components 25 which may, by way of example and not by limitation be one or more prepackaged integrated circuit chips, e.g. ball grid array packages 25a, thin small out line packages 25b, bare die 25c (shown wire bonded) or discrete electronic components such as capacitors or resistors 25d. Bare die may desirably be connected to second layer conductive trace 40 by means of conductive epoxy, solder or flip chip ball bond attachment.

The electronic components 25 comprise a user-defined electronic circuit or partial electronic circuit, at least one of which is in electrical connection with the second layer conductive trace 40 and second layer access lead 45.

As illustrated in FIGS. 1-4, layer 1 is further comprised of an interposer structure 50. Interposer structure 50 is preferably comprised of a dielectric or insulative organic material such as FR4 and comprises an interposer lateral surface 52. Interposer structure 50 may be provided as a four-sided layer comprising an aperture, or frame as shown in FIG. 2 or as a one, two or three sided structure so long as at least one interposer lateral surface 52 is provided. A preferred embodiment as shown in FIG. 2 comprises a non-conductive layer having an aperture defined therein for the receiving of an electronic component mounted on the first or second layer.

As seen in FIGS. 1 and 2, interposer structure 50 is bonded by means of a suitable adhesive to create a unitary structure defining package 1.

Turning back to FIG. 3, after bonding first layer 1, interposer structure 50 and second layer 30, the respective access leads 20 and 45 are prepared for metallization such as by lapping, grinding or saw-cutting one or more package lateral surfaces to define a substantially coplanar package lateral surface 55 with access leads exposed thereon. In this manner, the respective access leads and the respective lateral surfaces are substantially coplanar for subsequent metallization.

Predetermined ones of access leads 20 and 45 are electrically connected using, for instance, photolithographic processes to define one or more layer interconnect traces 60 on the package lateral surface 55 that define one or more "T-connect" structures 62. The layer interconnect traces 60 provide for the routing and interconnection of the electronic components on the layers in the package upon the package lateral surface 55

As seen in FIGS. 3 and 4, conductive pads 65 in electrical connection with predetermined second layer conductive traces are preferably provided for the receiving of solder balls 70 for the electrical connection of the package to an external conducive pattern such as a separate printed circuit board.

As best illustrated in FIG. 4, access leads on the respective first and second layers are shown in phantom and, in a functional package, are plated with an overlying conductive layer interconnect trace 60. In the illustrated embodiment, the access leads are connected by metalizing the entire package lateral surface 55, then a dicing saw used to delineate the various layer interconnect traces by saw-cutting through the metallization to the dielectric underneath to create one or more trenches 75. Laser or other ablation means can be used where appropriate.

Therefore, it must be understood that the illustrated embodiment has been set forth only for the purpose of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed even when not initially claimed in such combinations.

The words used in this specification to describe the invention and its various embodiments are to be understood not only in the sense of their commonly defined meanings, but to include by special definition in this specification, structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are therefore defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can, in some cases be excised from the combination and that the claimed combination may be directed to a sub-combination or variation of a sub combination.

Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the fundamental idea of the invention.

What is claimed is:

1. A multi-layer electronic package comprising:
   a first layer including opposing major surfaces, a first layer lateral surface, an opposite lateral surface on an opposite side of the first layer as the first layer lateral surface, and a first layer conductive trace, wherein each of the opposing major surfaces includes an electronic component disposed thereon, wherein at least one of the opposing major surfaces extends from the first layer lateral surface to the opposite lateral surface, and wherein the first layer conductive trace terminates on the first layer lateral surface to define a first layer access lead;
   a separately-formed interposer structure formed of a dielectric material and defining an interposer lateral surface, wherein the interposer structure has an aperture;
   a second layer including a second layer lateral surface and a second layer conductive trace, wherein the second layer conductive trace terminates on the second layer lateral surface to define a second layer access lead, wherein the first layer, the interposer structure, and the second layer are bonded together, wherein the first layer lateral surface, the interposer lateral surface, and the second layer lateral surface define a substantially coplanar package lateral surface, and wherein the interposer structure is disposed between the first and second layers;
   a conductive layer interconnect trace defined on the substantially coplanar package lateral surface, wherein the first layer access lead and the second layer access lead are in electrical communication; and
   a conductive member disposed on an outside surface of the multi-layer electronic package, wherein the conductive member is electrically connected to the second layer conductive trace and is configured for electrical connection with an external conductive pattern;
   wherein the aperture is configured to receive the electronic component from the first or second layer, and wherein there is an unfilled gap in the aperture between the interposer and the electronic component.

2. The multi-layer electronic package of claim 1, wherein the conductive layer interconnect trace is formed by:
   metallizing the entire package lateral surface; and
   delineating the metallization to form one or more trenches.

3. The multi-layer electronic package of claim 1, wherein the interposer structure comprises a frame having the aperture defined therein, and wherein the multi-layer electronic package is a finished product.

4. The multi-layer electronic package of claim 1, wherein the first layer comprises a multi-layer printed circuit board, and wherein package is an integral module.

5. The multi-layer electronic package of claim 1, wherein the first layer access lead is defined by a cross-sectional area of the first layer conductive trace, and wherein the conductive layer interconnect trace and the first and second access layer leads define one or more T-connect structures.

6. The multi-layer electronic package of claim 1, wherein the electronic component comprises one or more of a ball grid array package, a thin small outline package, a bare die, a discrete capacitor, or a discrete resistor.

7. The multi-layer electronic package of claim 1, wherein the electronic component comprises a bare die coupled to the second layer conductive trace by one or more of a conductive epoxy, a solder, or a flip-chip ball bond attachment.

8. The multi-layer electronic package of claim 1, wherein the second layer comprises a single or multi-layer printed circuit board including FR4 or an organic material, and wherein the substantially coplanar package lateral surface is formed by lapping, grinding, or saw-cutting at least a portion of the first layer, the second layer, or the interposer structure.

9. The multi-layer electronic package of claim 1, wherein the first layer, the interposer structure, and the second layer are bonded together with an adhesive, and wherein the adhesive does not fill the gap.

10. A multi-layer electronic package comprising:
    a first layer including opposing major surfaces, a first layer lateral surface, an opposite lateral surface on an opposite side of the first layer as the first layer lateral surface, and a first layer conductive trace, wherein each of the opposing major surfaces includes an electronic component disposed thereon, wherein at least one of the opposing major surfaces extends from the first layer lateral surface to the opposite lateral surface, and wherein the first layer conductive trace terminates on the first layer lateral surface to define a first layer access lead;
    a separately-formed interposer structure formed of a dielectric material and defining an interposer lateral surface, wherein the interposer structure has an aperture;
    a second layer including a second layer lateral surface and a second layer conductive trace, wherein the second layer conductive trace terminates on the second layer lateral surface to define a second layer access lead, wherein the first layer, the interposer structure, and the second layer are bonded together, wherein the first layer lateral surface, the interposer lateral surface, and the second layer lateral surface define a substantially coplanar package lateral surface, and wherein the interposer structure is disposed between the first and second layers;
    a conductive layer interconnect trace defined on the substantially coplanar package lateral surface, wherein the first layer access lead and the second layer access lead are in electrical communication;
    an integrated circuit chip including a bond pad in electrical connection with at least one of the first or second layer conductive traces; and
    a conductive member disposed on an outside surface of the multi-layer electronic package, wherein the conductive member is electrically connected to the second layer conductive trace and is configured for electrical connection with an external conductive pattern;
    wherein the aperture is configured to receive the electronic component from the first or second layer, and wherein there is an unfilled space in the aperture between the interposer and the electronic component.

11. The multi-layer electronic package of claim 10, wherein the integrated circuit chip is flip-chip bonded to at least one of the first or second layer conductive traces.

12. The multi-layer electronic package of claim 10, wherein the integrated circuit chip is wire bonded to at least one of the first or second layer conductive traces.

13. The multi-layer electronic package of claim 10, wherein the integrated circuit chip is in electrical connection with at least one of the first or second layer conductive traces by means of a conductive epoxy.

14. The multi-layer electronic package of claim 10, wherein the integrated circuit chip comprises a ball grid array package.

15. The multi-layer electronic package of claim 10, wherein the integrated circuit chip comprises a thin small outline package.

16. The multi-layer electronic package of claim 10, further comprising a discrete electronic component.

17. The multi-layer electronic package of claim 16, wherein the discrete electronic component comprises a surface-mounted device.

18. A system comprising:
   a first layer including:
      opposing major surfaces;
      a first layer lateral surface;
      an opposite lateral surface on an opposite side of the first layer as the first layer lateral surface;
      a first layer conductive trace; and
      a first layer access lead formed by an end portion of the first layer conductive trace on the first layer lateral surface, wherein each of the opposing major surfaces includes an electronic component disposed thereon, and wherein at least one of the opposing major surfaces extends from the first layer lateral surface to the opposite lateral surface;
   a separately-formed interposer including a dielectric material or an insulative organic material and defining an interposer lateral surface, wherein the interposer has an aperture;
   a second layer including:
      a second layer lateral surface;
      a second layer conductive trace; and
      a second layer access lead formed by an end portion of the second layer conductive trace on the second layer lateral surface;
   wherein the first layer, the interposer structure, and the second layer are bonded together;
   wherein the first layer lateral surface, the interposer lateral surface, and the second layer lateral surface define a substantially coplanar package lateral surface; and
   wherein the interposer structure is disposed between the first and second layers;
   a conductive layer interconnect trace overlying the substantially coplanar package lateral surface and electrically coupling the first layer access lead and the second layer access lead; and
   a conductive member disposed on an outside surface of the system, wherein the conductive member is electrically connected to the second layer conductive trace and is configured for electrical connection with an external conductive pattern;
   wherein the aperture is configured to receive the electronic component from the first or second layer while leaving an unfilled gap in the aperture between the interposer and the electronic component.

19. The system of claim 18, wherein the interposer comprises a substantially square-shaped frame, and wherein the system is a finished product.

20. The system of claim 18, wherein the first layer, the interposer structure, and the second layer are bonded with an adhesive, and wherein the substantially coplanar package lateral surface is formed by partially removing the first layer, the interposer structure, and the second layer.

* * * * *